(12) United States Patent
French, Jr.

(10) Patent No.: US 6,494,100 B1
(45) Date of Patent: Dec. 17, 2002

(54) CIRCUIT AND APPARATUS FOR VERIFYING A CHAMBER SEAL, AND METHOD OF DEPOSITING A MATERIAL ONTO A SUBSTRATE USING THE SAME

(75) Inventor: Norman L. French, Jr., Pflugerville, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/611,714

(22) Filed: Jul. 6, 2000

Related U.S. Application Data

(62) Division of application No. 08/957,547, filed on Oct. 24, 1997, now Pat. No. 6,105,435.

(51) Int. Cl.⁷ .............................. G01L 7/00
(52) U.S. Cl. ...................................... 73/714
(58) Field of Search ........................ 73/714, 756, 37, 73/754; 137/554, 557, 587.5, 480, 8; 422/2, 3

(56) References Cited

U.S. PATENT DOCUMENTS

| | | | |
|---|---|---|---|
| 3,895,572 A | * | 7/1975 | Nitschke .................. 100/35 |
| 4,457,892 A | * | 7/1984 | Young ...................... 422/2 |
| 4,503,807 A | | 3/1985 | Nakayama |
| 4,625,678 A | | 12/1986 | Shioya et al. |
| 4,654,106 A | | 3/1987 | Davis et al. |
| 4,657,621 A | | 4/1987 | Johnson et al. |
| 4,673,101 A | | 6/1987 | Guarino et al. |
| 4,674,443 A | | 6/1987 | Furukawa et al. |
| 4,687,542 A | | 8/1987 | Davis |
| 4,785,962 A | | 11/1988 | Toshima |
| 4,832,778 A | | 5/1989 | Davis et al. |

(List continued on next page.)

FOREIGN PATENT DOCUMENTS

| | | |
|---|---|---|
| EP | 0 440 377 | 8/1991 |
| EP | 0 140 755 | 9/1991 |
| EP | 0 446 657 | 9/1991 |
| EP | 0 379 972 | 3/1993 |
| EP | 0 291 690 | 6/1994 |
| EP | 0 472 112 | 11/1996 |

OTHER PUBLICATIONS

Chu, Liang T., "Safety Interlock and Remote Computer Monitoring for a Diffusion–Pumped Vacuum System," J. Vac. Sci. Technol. A, vol. 15, No. 1, Jan./Feb. 1997, pp. 201–205.

Vol'pyan et al., "Automatic Gas–Pressure Regulator in a Vacuum Chamber," J. Opt. Technol., vol. 64, No. 1, Jan. 1997, pp. 66–67.

*Primary Examiner*—Harshad Patel
(74) *Attorney, Agent, or Firm*—Kevin L. Daffer; Conley, Rose & Tayon P.C.

(57) ABSTRACT

An improved door closure indicator is provided. The indicator operates on pressure levels read within a pressurized chamber rather than from proximity switches coupled between the chamber and the door. If the door seals to the chamber, pressure within the chamber will quickly change, and the change will be read on a pressure sensor indicative of the door closure. According to one example, the chamber can comprise a vacuum chamber and the pressure sensor can be a vacuum monitor. Once vacuum is detected, it is determined with more absolutism that the door is actually closed rather than having to rely upon switch operation and/or alignment of the door activation mechanism to proximity switches arranged on the chamber housing. The processing tool which embodies the chamber includes a chamber controller which incorporates various switches and relays which channel pressure readings taken from the chamber to a load controller, and also delays pressure readings after opening a half-gate valve operably coupled between a vacuum pump and the chamber.

18 Claims, 3 Drawing Sheets

U.S. PATENT DOCUMENTS

| | | |
|---|---|---|
| 4,842,686 A | 6/1989 | Davis et al. |
| 4,851,018 A | 7/1989 | Lazzari et al. |
| 4,892,615 A | 1/1990 | Motta |
| 4,907,526 A | 3/1990 | Walde et al. |
| 4,952,299 A | 8/1990 | Chrisos et al. |
| 4,967,337 A | 10/1990 | English et al. |
| 4,999,458 A | 3/1991 | Kunz |
| 4,999,671 A | 3/1991 | Iizuka |
| 5,002,010 A | 3/1991 | Weinberg |
| 5,013,384 A | 5/1991 | Mellink et al. |
| 5,019,233 A | 5/1991 | Blake |
| 5,092,728 A | 3/1992 | Crabb et al. |
| 5,125,360 A | 6/1992 | Nakayama et al. |
| 5,135,635 A | 8/1992 | Ikeda |
| 5,145,303 A | 9/1992 | Clarke |
| 5,152,309 A * | 10/1992 | Twerdochlib et al. .......... 137/8 |
| 5,158,230 A * | 10/1992 | Curran ...................... 236/49.4 |
| 5,202,008 A | 4/1993 | Talieh et al. |
| 5,260,547 A | 11/1993 | Houzay et al. |
| 5,275,303 A | 1/1994 | Szalai |
| 5,316,794 A | 5/1994 | Carlson et al. |
| 5,345,814 A | 9/1994 | Cur et al. |
| 5,362,526 A | 11/1994 | Wang et al. |
| 5,398,481 A | 3/1995 | Takeuchi et al. |
| 5,401,319 A | 3/1995 | Banholzer et al. |
| 5,435,682 A | 7/1995 | Crabb et al. |
| 5,536,330 A | 7/1996 | Chen et al. |
| 5,565,058 A | 10/1996 | Banholzer et al. |
| 5,582,866 A | 12/1996 | White |
| 5,651,625 A * | 7/1997 | Smith et al. ................. 400/691 |
| 6,120,611 A * | 9/2000 | Guan et al. ................. 118/733 |

\* cited by examiner

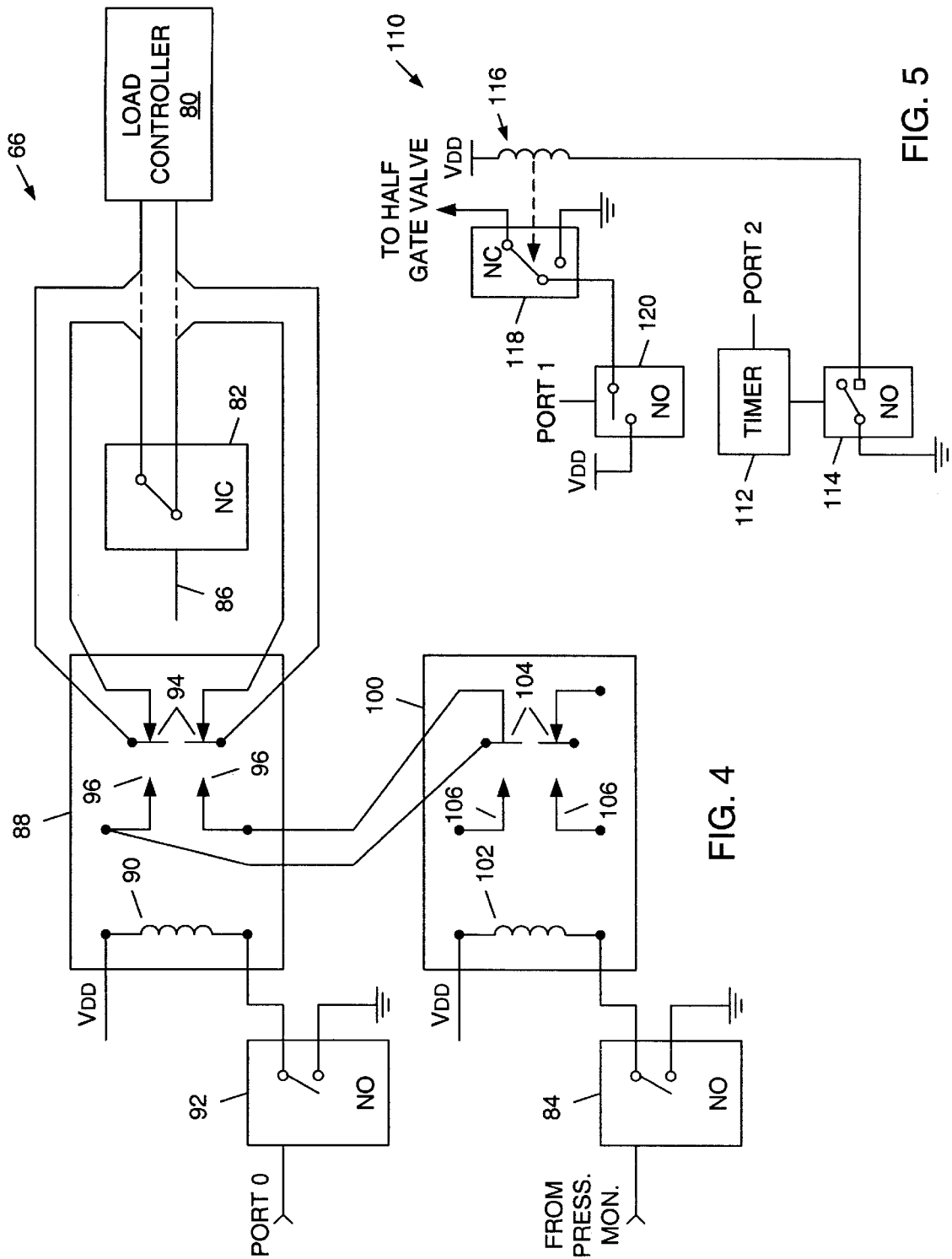

CIRCUIT AND APPARATUS FOR VERIFYING A CHAMBER SEAL, AND METHOD OF DEPOSITING A MATERIAL ONTO A SUBSTRATE USING THE SAME

This is a Division of application Ser. No. 08/957,547, filed Oct. 24, 1997 now U.S. Pat. No. 6,105,435.

BACKGROUND OF THE INVENTION

1. Field of the Invention

This invention relates to a vacuum chamber and, more particularly, to a circuit and apparatus for verifying evacuation of the chamber after a substrate is loaded into the chamber for processing.

2. Description of the Related Art

A substrate is generally defined as a material upon which processing takes place. For example, a substrate can receive deposition, etch, implant, heat (anneal) and various clean cycles. A popular type of substrate is one which is silicon-based and generally known as a semiconductor wafer. Substrate, however, is a term henceforth used to encompass any object which receives processing and therefore is defined to extend beyond a semiconductor wafer.

In many instances, optimal substrate processing involves placing the substrate inside a chamber containing an ambient dissimilar from that which surrounds the chamber. Ambient within the chamber may be controlled to ensure processing is carried out according to a specific processing "recipe." Using the semiconductor wafer example, certain types of deposition require wafers within a chamber be subjected to a vacuum and substantial temperatures. Low pressure, high temperature deposition upon the wafer is well recognized as, for example, low pressure chemical vapor deposition ("LPCVD"). Low pressure processing to produce a LPCVD film is but one example of many involving a chamber and pressurization within that chamber. Pressurization levels within a chamber to effectuate optimal processing of the substrate is critical not only to produce accurate film properties, but also to minimize contamination within the chamber during any or all of the various processing steps beyond deposition.

When film is being deposited, etchant delivered, dopants implanted or temperatures applied, it is important that extraneous material not be allowed to enter the chamber during those critical processing steps. For example, if gas or particulate matter enters the chamber during LPCVD processing, the ensuing film may suffer improper conformality and/or electrical properties. It is therefore desired that the chamber ambient receive proper pressurization levels before processing is applied to the substrate. This implies that all apertures and/or orifices into the chamber be sealed after the substrate is loaded and before the substrate is processed.

FIG. 1 illustrates one example of an application involving a chamber 10 which can be pressurized (i.e., a pressurized chamber). A mechanism 12 is used for loading one or more substrates 14 into chamber 10 prior to evacuating the chamber. In the example provided, chamber 10 may be configured as a horizontal tube LPCVD reactor which can be used to deposit doped or undoped dielectric films upon exposed surfaces of substrate 14. Further to that example, substrate 14 may be a silicon-based semiconductor wafer fixed on edge within a carrier secured to a paddle or plunger 16. Thus, the carrier which secures one or more wafers, defined as substrate 14, may be secured to a door 18 to which plunger 16 is coupled. Within the semiconductor fabrication industry, chamber 10 can be referred to as a furnace or reactor, which can receive radiated heat via resistive heating coils surrounding the reactor. Chamber 10 interior walls may be made of quartz or metallic material which are somewhat inert to reactant gasses 20 metered into chamber 10 at one end of the chamber. The other end of chamber 10 is coupled to a vacuum pump which extracts reactant byproducts 22 in the direction shown.

Metering the reactant gasses 20, and evacuating byproducts 22 occur only if it is known that the inside of chamber 10 is properly sealed. This requires knowing that door 18 is properly sealed against exterior ambient ingress. Door 18 may be designed to close in the direction of arrows 24 until a seal occurs between a flange 26 at one end of chamber 10 and a sealing membrane 28 arranged on a chamber-facing surface of door 18. Membrane 28 may comprise an o-ring, and flange 26 may be stainless steel or quartz. Flange 26 comprises a relatively planar surface upon which membrane 28 can be compressed when door 18 closes. Once compressed, membrane 28 seals the interface between door 18 and chamber 10.

Before processing can occur (i.e., before reactant gas is metered into the chamber and byproducts removed), it is important to ensure the chamber's integrity by verifying closure of door 18. Many conventional mechanisms are available to provide door closure verification. A popular mechanism may involve a proximity switch 30 mounted to the exterior surface of chamber 10. Proximity switch 30 is generally considered a "contact" switch which movably reciprocates when placed in contact with a protrusion 32 of door 18. Merely as an example, door 18 may include a protrusion 32 and chamber 10 exterior housing may include a receptacle 33. As protrusion 32 enters receptacle 33 toward which switch 30 extends, protrusion 32 surface will contact and thereafter move the switch lever from a normally open position to a closed position. Of course, there may be numerous other mechanisms on which switch 30 is mounted and from which switch 30 is activated. The receptacle/protrusion mechanism is shown only as an example.

Entry of protrusion 32 into the receptacle 33 of chamber 10 hopefully coincides with the compression (i.e., seal) of membrane 28 against flange 26. When moved, protrusion 32 should manually brush against the lever of switch 30, causing that lever to transition upon a contact as shown in further detail in FIG. 2. FIG. 2 illustrates closure of lever 34 between a pair of contacts 36a and 36b. Closure of lever 34 across contacts 36 produces a signal from switch 30 upon conductor 38.

In many instances, there may be two switches. A second switch 40 may be present as shown in FIGS. 1 and 2. Switch 40 may suffice as a back up if switch 30 is rendered inoperable. Switch 40 may also serve as a fail stop to prevent protrusion 32 from unduly pressing against chamber 10 housing should switch 30 fail. Switch 40, similar to switch 30, comprises a pair of contacts 42a and 42b, and a lever 44 which reciprocates between contacts 42. A conductor 46 extends from switch 40 to indicate status of the switch and, more importantly, whether door 18 is closed against flange 26.

The nature of proximity switches in general and the mechanism by which they are mounted does not always allow accurate verification of door closure. Proximity switches rely upon movement of the levers 34 and 44 when contacted with protrusion 32. If the protrusion and/or door should become misaligned, then actuation of levers may not occur indicating the door is open when in fact it is closed.

Furthermore, integrity of the contacts may be lessened through extensive wear, also resulting in a switch that is open when the door is actually closed. Conversely, membrane 28, and the integrity by which membrane 28 mates with flange 26, may be reduced after repeated door closure so that the seal between those structures will eventually fail even though switches 30 and 40 indicate switch closure.

Conventional proximity switches and their use in verifying door closure is therefore not always absolute. In actuality, proximity switches mostly determine the status of the switches and not necessarily the status of door closure or, more importantly, status of pressure within the chamber. If the door is closed but the switches fail and do not indicate closure, then the processing tool will hold off its processing until the misreading problem has been solved. This can reduce processing throughput. Conversely, if the switches indicate the door is closed and yet the door is open, then gasses external to the chamber will be drawn into the chamber along with the evacuated byproducts. Ingress of, for example, oxygen or hydrogen into chamber 10 during LPCVD oxide or nitride formation may contaminate the ensuing dielectric film and jeopardize the electrical properties of that film. In a worst case situation, toxic or flammable gasses may enter the chamber through the partially open door 18, causing a possible fire or a toxic cloud to form within the chamber. A more likely scenario is the door is slightly ajar even though the switches indicate the door is sealed against chamber 10. When vacuum is drawn to the chamber, particles are agitated across the substrate as turbulence is created through the slight opening between the chamber 10 and door 18. Sufficient particles within what should be a pristine deposited film may cause significant yield loss of the final product. In the case of semiconductor wafers, particulate count on the silicon substrate or within a deposited oxide film may, in the extreme, cause improper shorting of dielectrically spaced conductors.

It is therefore desired that a mechanism be derived which can accurately verify door closure in a pressurized chamber. Instead of monitoring switch operation, it would be more prudent to monitor pressure levels within the chamber since, in fact, it is pressure level that dictates whether or not the door is actually closed and sealed.

SUMMARY OF THE INVENTION

The problems outlined above are in large part solved by a door verification system hereof. The verification system includes a mechanism for monitoring ambient pressure within a pressurized chamber. The pressure level produced within the chamber is defined to be greater than or less than atmospheric pressure, i.e., 760 torr. According to a one embodiment, the pressure level of which the present mechanism monitors is defined as a pressure differential between the inside and the outside of the chamber. If the pressure outside the chamber is 760 torr, then the pressure sensor should activate at a differential of anywhere from 10 to 500 torr (e.g., about 260 to about 750 torr in absolute terms), preferably 20 to 300 torr differential (e.g., about 460 to 740 torr absolute), and more preferably 40 to 100 torr differential (e.g., about 660 to 720 torr absolute). Once the pressure status drops below a pre-defined, (i.e., atmospheric pressure value), then a more accurate indication of door closure can be achieved.

Pressure is preferably monitored within a vacuum line coupled to the chamber. Monitoring the vacuum line instead of the chamber itself prevents exposing the sensitive pressure sensors to the high temperatures and caustic chemicals normally associated with the chamber operation. Removing the sensors from the chamber yet maintaining the sensors in gaseous communication with the chamber affords minimal environmental corruption to those sensors and therefore enhances the longevity and accuracy of their readings.

The pressure sensor or sensors operate as a contained unit. When pressure within the chamber drops below a certain value, the pressure sensor will output a signal to a chamber controller. The chamber controller receives that signal and provides indication to a tool which is processing the substrate (i.e., processing tool) that the door is closed. Until that signal is received, a load controller within the chamber controller may continue to drive the door toward the chamber if door movement is called for.

The processing tool is defined as any tool which includes a chamber which can receive a substrate and a pressurized ambient. According to one example, the substrate may include a semiconductor wafer, and the processing tool may be a semiconductor manufacturing tool, such as an LPCVD tool, a plasma enhanced etch tool, an diffusion furnace, etc. The processing tool includes not only the chamber, but also a pressure delivery line (e.g., a vacuum line) coupled between a pressure source (e.g., a vacuum pump) and the chamber. Coupled to the delivery line is a pressure (e.g., vacuum) monitor and throttle valve. The vacuum monitor serves to indicate door closure, while the throttle valve regulates vacuum pressure within the chamber. Further included with the processing tool is a main valve, coupled between the vacuum source and the vacuum tube. A half valve and secondary conduit extends across the main valve between the vacuum source and the vacuum tube. The half valve may be operated before the main valve to draw a slight vacuum upon the chamber through the secondary conduit.

The secondary conduit, in combination with the main suction tube, provide a two-step vacuum sequence. The first step draws lower amounts of vacuum across the vacuum monitor, triggering the vacuum monitor that the door is closed as readings drop below 1.0 atmospheres (or 760 torr). The half-gate valve within the secondary tube, must therefore be open after the door is closed to allow the vacuum monitor to achieve a vacuum reading. A timed delay therefore exist between the time in which the half-gate valve is open and the vacuum monitor checks for chamber evacuation. Accordingly, a circuit is present which performs the desired delay. The circuit also properly sequences opening of the half gate valve after manually closing the door and before checking the vacuum monitor. An additional circuit is provided to select whether the vacuum monitor or a conventional proximity switch should determine door closure. A relay may be used to perform that selection. If active, the relay coil will draw corresponding wipers from one post to another within the relay. The drawn wiper will then select the pressure monitor to indicate proper door closure rather than proximity switches. For example, if the pressure reading is below a pre-defined value, then the substrate load controller will see an open circuit as directed through the relay, indicative of door closure. An open circuit signals the load controller that the door is closed and that further movement of the door is not needed. If the relay coil is not active, then the load controller will see either an open or a closed circuit mandated by the proximity switch. Accordingly, retrofit to existing proximity switches is easily accomplished using a relatively few circuit components comprising, according to one embodiment, a pair of relays and a pair of switches.

Broadly speaking, the present invention concerns an apparatus for determining closure of a door. The apparatus comprises a chamber having first and second apertures extending into the chamber. A pressure delivery unit is coupled to the first aperture and a pressure monitor is coupled in gaseous communication with the pressure delivery unit. The pressure monitor can therefore determine sealed closure of the door over the second opening when a pressure reading within the pressure monitor varies from a pre-defined amount. According to one example, the pre-defined amount is atmospheric pressure. According to another embodiment, the pressure delivery unit is a vacuum pump and the pressure monitor is a vacuum monitor. When the pressure level read by the vacuum pump drops below, e.g., 760 torr, sealed closure of the door is verified.

The present invention further concerns a circuit indicating a pressure level within a semiconductor fabrication chamber. The circuit includes a pressure monitor switch placed in gaseous communication with the chamber. A load controller is operably coupled to receive indication of a pressure fluctuation within the chamber as a result of power applied to the controller. A relay is coupled between the pressure monitor switch and the controller for applying the power during times when the switch is in a state determinative of the pressure level.

The present invention yet further concerns a method for verifying closure of a vacuum sealed door across an aperture extending into a semiconductor fabrication chamber. The method comprises driving the door into hopefully a closed position across the aperture. Thereafter, a first vacuum is applied to the chamber. Sealing of the door across the chamber is then verified if the first vacuum amount causes pressure within chamber to drop below atmospheric pressure. Applying the first vacuum comprises drawing gas and/or fluid from the chamber through a secondary conduit of relatively small diameter compared to the diameter of a main conduit. A second vacuum amount greater than the first vacuum amount is applied subsequent to verifying seal of the door. Applying the second vacuum comprises drawing gas and particulate matter from the chamber through the main conduit to draw pressure within the chamber further below atmospheric pressure. The secondary conduit can draw pressure less than one atmosphere while the main conduit can draw pressure less than 300 millitorr.

BRIEF DESCRIPTION OF THE DRAWINGS

Other objects and advantages of the invention will become apparent upon reading the following detailed description and upon reference to the accompanying drawings in which:

FIG. 4 is a circuit diagram of switches used to control loading of the substrate carrier and door into and onto, respectively, the chamber of FIG. 3, wherein signals forwarded to and from the chamber controller verify loading of the substrate carrier and door closure; and FIG. 5 is a circuit diagram of switches used to ensure evacuation of the chamber via a half gate valve prior to reading door closure through a pressure reduction within the chamber, wherein pressure readings taken after half gate evacuation occurs in a pre-defined sequence of steps.

Figure 1:
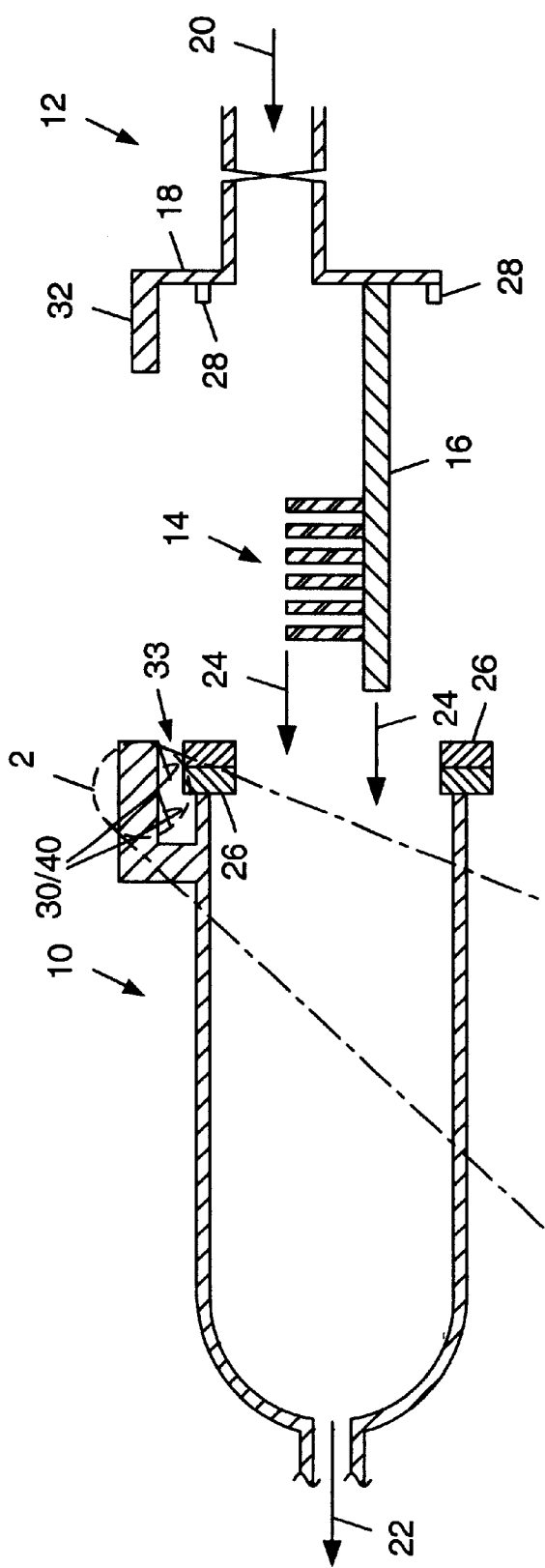
FIG. 1 is a cross sectional view of a chamber which can be sealed by a door to surround a substrate carrier placeable into the chamber.
Figure 2:
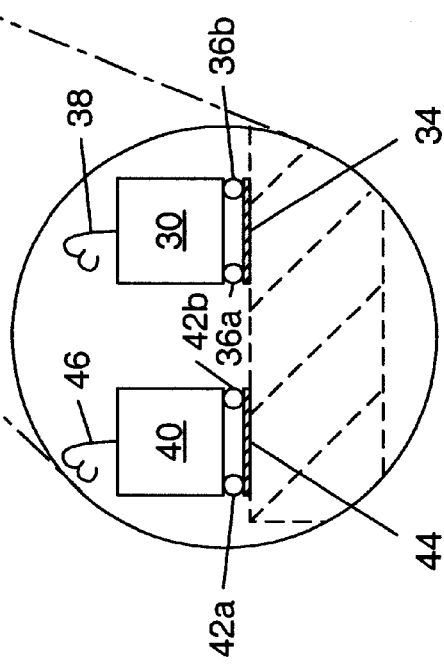
FIG. 2 is a detailed view of area 2 of FIG. 1 illustrating proximity switches mounted upon one end of the chamber to indicate closure of the door.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 3:
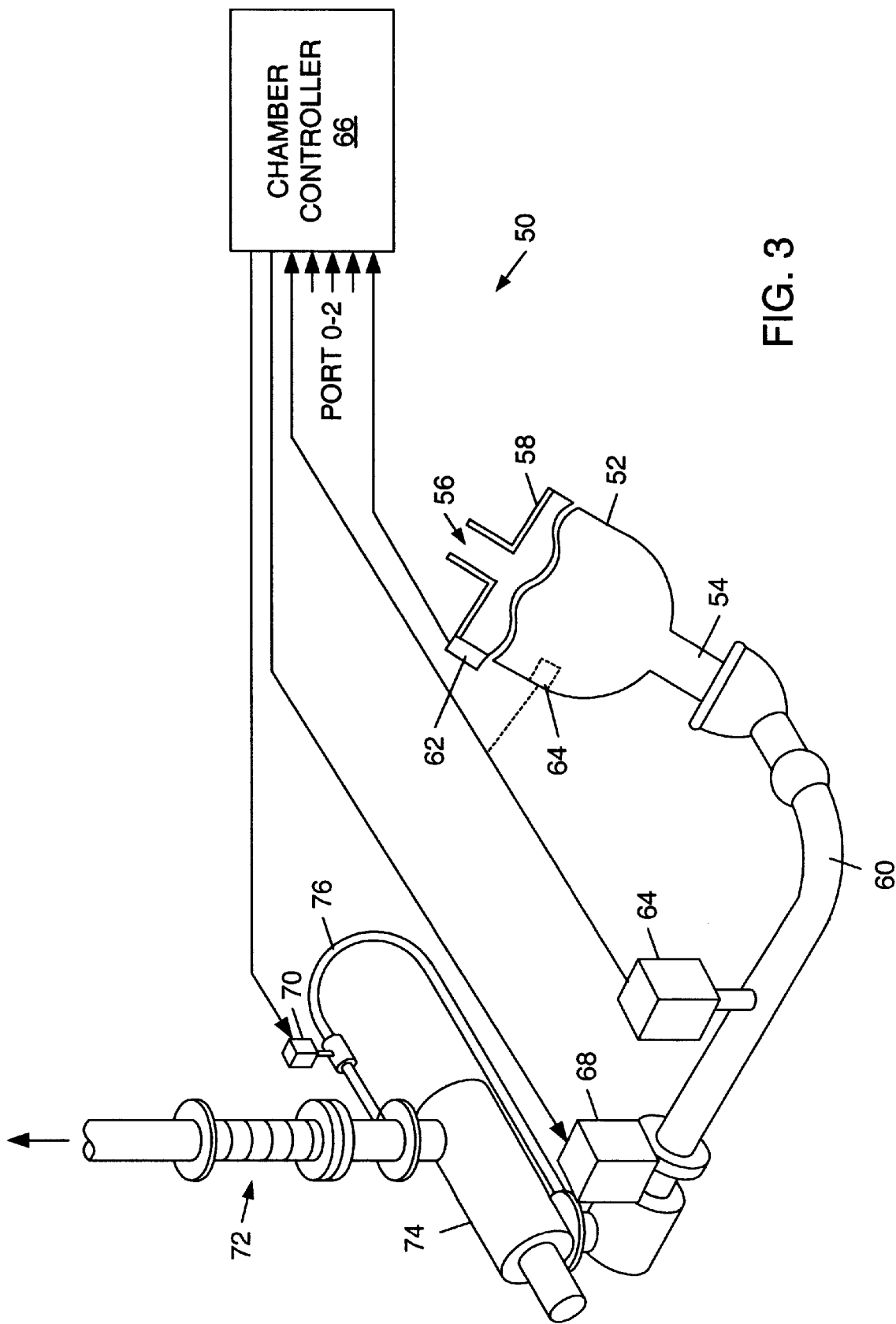
FIG. 3 is a perspective view of a vacuum system connected to one end of the chamber opposite the door, wherein the vacuum system is monitored and operated via a chamber controller.

Turning now to the drawings, FIG. 3 illustrates a processing tool 50 used possibly in the formation and/or removal of material from a semiconductor-type substrate. Processing tool 50 includes a chamber 52 which can be pressurized (i.e., preferably evacuated). Chamber 52 includes a pair of apertures 54 and 56 arranged on opposed ends of chamber 52. Aperture 56 extends through door 58, while aperture 54 is coupled to a pressure (or vacuum) delivery tube 60. A vacuum may be delivered through tube 60 during times when door 58 is secured to chamber 52. Aperture 56 may be used to allow reactant gasses into chamber 52, while tube 60 draws the reactant gasses across the substrate via a gas delivery system coupled to opening 56 of door 58.

Indication of door closure can occur either from a proximity switch 62 mounted to chamber 52 or from a pressure monitor 64 mounted to tube 60. Both switch 62 and monitor 64 are coupled by respective conductors to a chamber controller 66. Controller 66 includes many circuits and additional sub-controllers used to monitor conditions within chamber 52 and follow a specific fabrication sequence or recipe. Most modern processing tools include a chamber controller which is programmed to follow a pre-defined sequence of processing steps needed to produce a film, etch through a film, or implant species, for example.

A suitable controller for performing a sequence of processing steps is shown as reference numeral 66. Controller 66 is designed to receive various signals indicating processing tool 50 operation, and is further designed to dispatch signals to processing tool 50 in response to that operation. Linking processing tool 50 to chamber controller 66 is a bus containing multiple conductors, some of which are dedicated input conductors and some of which are dedicated output conductors. Input conductors can be derived from pressure monitor 64 and proximity switch 62, whereas output conductors can be forwarded to, e.g., a throttle valve 68 and a half-gate valve 70. Chamber controller 66 can therefore monitor the status of chamber 52 ambient pressure and, responsive to that pressure, adjust the pressure by opening or closing a throttle valve 68, or opening or closing a half-gate valve 70. The half-gate valve will be open primarily during periods prior to the main valve being open, as described below.

Tube 60 is coupled between a pressure source, e.g., vacuum pump 72 and aperture 54. Suction tube 60 has an inner diameter which is relatively large and is capable of receiving the full vacuum force derived by pump 72 during times in which a main valve 74 is open. Coupled across main valve 74 is a secondary conduit 76. Conduit 76 is substantially smaller in inner diameter than a main conduit alternatively known as tube 60.

A half-gate valve placed within the secondary conduit 76 determines whether pressure (e.g., vacuum) will be delivered across, and external to, main valve 74. Thus, if main valve 74 is closed, half-gate valve 70 may be opened to allow relatively small vacuum pressure to be delivered to tube 60, and eventually to chamber 52. Subsequently, main valve 74 can be opened to allow full vacuum pressure. Chamber controller 66 actuates the main valve and the half-gate valve in timed sequence so that pressure delivered by half-gate valve 70 will trigger monitor 64 when door 58 is closed. The small amount of vacuum delivered by half-gate valve 70 can then be followed with a greater vacuum through main valve 74 after which monitor 64 verifies door closure.

Sequential delivery of vacuum minimizes particulate disturbances within chamber 52. In particular, a small vacuum slightly less than atmospheric pressure can be used to verify door closure without stirring up substantial particulate matter within chamber 52, such as would be the case if full vacuum pressure less than, e.g., one torr were applied. If main valve 74 is opened, vacuum pump 72 can drive the vacuum pressure within chamber 52 below one torr, and in most instances less than 300 millitorr.

FIG. 4 illustrates a circuit diagram of various circuitry partially within chamber controller 66. More specifically, chamber controller 66 includes a load controller 80 which provides indication of substrate loading into chamber 52. Loading the chamber and, more specifically, closing the door to the chamber is controlled either by switch 82 or switch 84. Switch 82 may be a normally closed switch, which opens only if the conductor forwarded from the proximity switches 62 (shown in FIG. 3) carries a signal indicating closure of proximity switch 62. If switch 82 is selected and is open, then load controller 80 sees an open circuit indicating to controller 80 that the door is closed. The conductor linking proximity switch 62 (shown in FIG. 3) and switch 82 in FIG. 4 is denoted as reference numeral 86.

A relay 88 may be used to connect switch 84 to controller 80 in lieu of switch 82. Relay 88 includes a coil 90 which can be selectively energized when normally opened switch 92 closes. An energized coil 90 draws wipers 94 from the position shown to conductors 96. When this occurs, connection to load controller 80 is redirected from switch 82 to relay 100.

Switch 92 is selectively closed whenever the processing tool forwards a signal from an output port ("PORT 0") to chamber controller 66. PORT 0 is an unused output conductor derived from the processing tool 50. The signal within PORT 0 can be programmed to produce a voltage value suitable for activating or deactivating switch 92.

A programmed signal on PORT 0 will close switch 92, activating coil 90, and thereby connecting controller 80 to switch 84. Switch 84, being normally open, is closed if, for example, input from pressure monitor 64 indicates a pressure level below atmospheric pressure (i.e., below 760 torr). When switch 84 is closed, coil 102 will be energized and wipers 104 will move to conductors 106 to present an open circuit to load controller 80.

An open circuit, either derived from switch 82 or switch 84, will signal that the proximity switches are closed or the pressure level is below a pre-defined amount, respectively. The result of an open circuit, in either instance, is the door being closed. However, proximity switch 82 may not, in all instances, indicate door closure as described above. Thus, the need to select a pressure monitor instead of a proximity switch to determine door closure is desirable.

Turning to FIG. 5, a delay circuit 110 is shown. Delay circuit 110 can be included within chamber controller 66 to achieve proper timing in instances where the processing tool follows incremental (i.e., stepped) processing steps. PORT 2 signal initiates operation of timer 112, and timer 112 maintains switch 114 in a closed position to allow coil 116 to become energized. It is not until after timer 112 times out that switch 114 moves back to a normally open condition. Once energized, coil 116 activates the wiper of switch 118 from a normally closed position to an open position. The normally closed position is shown in FIG. 5. Thus, with timer 112 timing out, switch 118 maintains, or moves back to its normally closed position to couple switch 120 to the half-gate valve. Switch 120 transitions from a normally open position to a closed position whenever a switching signal occurs in PORT 1. With switch 120 closed, the power supply ($V_{DD}$) is connected to the half-gate valve after the timer times out. This ensures the half-gate valve is open for a time sufficient to evacuate the chamber via the secondary conduit prior to reading the evacuate condition upon the vacuum monitor. The half-gate valve is active only for the time in which coil 116 is de-energized, and switch 120 is closed. After the timer times out, coil 116 is de-energized and switch 118 transitions back to the normally closed position. The time-out duration exceeds the time necessary to close the door against the chamber flanges. This ensures a "door closed" condition is read by the vacuum monitor prior to the time at which the chamber controller looks for indication of the door closed condition. Thus, delay circuit 110 provides a timed sequence of the half-gate valve opening relative to vacuum chamber readings, and further ensures the vacuum readings are taken at the proper time sequence dictated by the particular processing tool.

Various processing tools may require the delay circuit 110 shown in FIG. 5 depending upon their operation and the particular time in which the half-gate valve is open relative to the time in which door closure indication is needed. Accordingly, delay circuit 110 is shown for a specific application and is exemplary of only one of numerous types of processing tools requiring the timed delay feature.

It will be appreciated to those skilled in the art having the benefit of this disclosure that this invention is believed applicable to any substrate processing tool having a pressurized chamber. Description as to a low pressure chamber may also be applicable to a high pressure chamber, wherein the vacuum monitor is deemed a pressure monitor, and the door closure is dependent on the pressure level within the pressurized chamber. The substrate includes, for example, a semiconductor wafer, but it is not limited solely to a semiconductor wafer. It is understood that the form of the invention shown is to be taken as exemplary, presently preferred embodiments. Regardless of the processing tool, reactor configuration, and/or application, the present invention is suited for any processing tool which employs a pressurized chamber and a substrate placeable within the pressurized chamber via a door. Accordingly, the specification and drawings are to be regarded in an illustrative rather than a restrictive sense as to possibly numerous variations which fall within the spirit and the scope of the present invention.

What is claimed is:

1. A circuit for indicating a pressure level within a semiconductor fabrication chamber, said circuit comprising:
   a pressure monitor switch placed in gaseous communication with the chamber;
   a controller operably coupled to the chamber for indicating sealing of a door over an aperture extending into the chamber in response to a signal applied to the controller; and a relay coupled between the pressure monitor switch and the controller for applying said signal to the controller during times when the switch is in a state determinative of a pre-defined pressure level, wherein the relay comprises a coil adapted to prevent the signal from being applied to the controller when the pressure monitor switch is placed in a state determinative of a pressure level different than the pre-defined pressure level.

2. The circuit as recited in claim 1, wherein said controller further comprises a motor coupled to drive the door to a sealed position over the aperture during times when the switch is in the state determinative of a pressure level within the chamber above a pre-defined amount.

3. The circuit as recited in claim 2, wherein said pressure monitor switch is normally open unless the pressure level within the chamber extends below the pre-defined amount.

4. The circuit as recited in claim 1, wherein said pressure monitor switch is mounted through a sidewall of a main conduit extending into said chamber.

5. The circuit as recited in claim 4, further comprising a main valve placed within the main conduit and a secondary valve placed within a secondary conduit routed to bypass the main valve.

6. The circuit as recited in claim 5, wherein pressure of the gas delivered through the secondary conduit to the chamber is controlled by the secondary valve.

7. The circuit as recited in claim 6, wherein the secondary valve is controlled by a secondary valve switch which activates the secondary valve prior to when the pressure monitor switch is in the state determinative of said pressure level.

8. A circuit for indicating closure of a door allowing access to a semiconductor fabrication chamber, said circuit comprising:

a pressure monitor switch placed in communication with the chamber;

a controller adapted to perform said indicating in response to a signal from the pressure monitor switch; and a proximity switch placed in communication with the chamber; wherein the controller is further adapted to perform said indicating in response to a signal from the proximity switch.

9. The circuit of claim 8, wherein said controller is further adapted to perform said indicating after both of the signals from the pressure monitor switch and proximity switch are received.

10. The circuit of claim 8, further comprising a relay adapted to connect the pressure monitor switch and the controller upon receiving the signal from the pressure monitor switch.

11. The circuit of claim 8, wherein said signal indicates a pressure level below a predetermined setpoint.

12. The circuit of claim 11, wherein said predetermined setpoint is atmospheric pressure.

13. The circuit of claim 8, wherein said controller comprises a delay circuit adapted to delay a measurement of said pressure level.

14. The circuit of claim 13, wherein said delay circuit is activated for a duration that exceeds an amount of time necessary to close the door.

15. A circuit for indicating closure of a semiconductor fabrication chamber door, said circuit comprising:

a pressure monitor switch placed in communication with the chamber; and a controller adapted to perform said indicating in response to a signal from the pressure monitor switch, wherein said signal is sent when a pressure monitor coupled to the switch is in a state determinative of a pressure level below a predetermined setpoint.

16. The circuit of claim 15, wherein said pressure monitor switch is arranged within the chamber.

17. The circuit of claim 15, further comprising a proximity switch placed in communication with the chamber, wherein the controller is further adapted to perform said indicating in response to a signal from the proximity switch.

18. The circuit of claim 15, further comprising a relay adapted to connect the pressure monitor switch and the controller upon receiving the signal from the pressure monitor switch.

* * * * *